(12) United States Patent
Chuang et al.

(10) Patent No.: US 12,191,175 B2
(45) Date of Patent: Jan. 7, 2025

(54) NOZZLE HAVING REAL TIME INSPECTION FUNCTIONS

(71) Applicant: TAIWAN SEMICONDUCTOR MANUFACTURING COMPANY LTD., Hsinchu (TW)

(72) Inventors: Kai-Lin Chuang, Chia-Iyi (TW); Tsung-Chi Chen, Taichung (TW); Pei-Jung Chang, Taichung (TW); Chun-Wei Huang, Taichung (TW); Jun Xiu Liu, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 98 days.

(21) Appl. No.: 17/831,386

(22) Filed: Jun. 2, 2022

(65) Prior Publication Data

US 2022/0293443 A1    Sep. 15, 2022

Related U.S. Application Data

(60) Continuation of application No. 16/709,378, filed on Dec. 10, 2019, now Pat. No. 11,355,370, which is a division of application No. 14/180,912, filed on Feb. 14, 2014, now Pat. No. 10,504,758.

(51) Int. Cl.
*H01L 21/67* (2006.01)
*B05B 12/08* (2006.01)
*H01L 21/66* (2006.01)

(52) U.S. Cl.
CPC ...... *H01L 21/67253* (2013.01); *B05B 12/082* (2013.01); *H01L 21/67288* (2013.01); *H01L 22/12* (2013.01); *H01L 22/26* (2013.01)

(58) Field of Classification Search
CPC ............ B05B 12/082; H01L 21/67253; H01L 21/67288; H01L 22/12; H01L 22/26
USPC .......................................................... 356/436
See application file for complete search history.

(56) References Cited

U.S. PATENT DOCUMENTS

| 5,657,123 A | * | 8/1997 | Mogi ................. B24B 49/12 356/503 |
| 2015/0133032 A1 | * | 5/2015 | Kubo ................. B24B 49/16 451/73 |
| 2016/0339695 A1 | * | 11/2016 | Chen ................. B41J 2/14032 |

FOREIGN PATENT DOCUMENTS

JP        2009534627 A   *   9/2009   ............ C21C 5/52

\* cited by examiner

*Primary Examiner* — Sunghee Y Gray
(74) *Attorney, Agent, or Firm* — WPAT LAW; Anthony King

(57) ABSTRACT

A method of manufacturing a semiconductor device includes: receiving a workpiece on which the semiconductor device is manufactured; causing a nozzle to dispense a fluid toward a surface of the workpiece external to the nozzle, wherein the nozzle includes a first channel and a second channel that allow the fluid to flow through; emitting light, by a light source, from within the nozzle toward the surface while the nozzle is dispensing the fluid; receiving light reflected from the surface by a light sensor, the light source and the light sensor being disposed within the nozzle and opposite to each other, and the emitted light and the reflected light adapted to be contained within the fluid; and examining a status of the reflected light. The emitted light and the reflected light propagate in a direction parallel to a longitudinal axis of each of the first channel and the second channel.

20 Claims, 7 Drawing Sheets

NOZZLE HAVING REAL TIME INSPECTION FUNCTIONS

PRIORITY CLAIM AND CROSS-REFERENCE

The present application is a continuation of U.S. application Ser. No. 16/709,378 filed Dec. 10, 2019, a divisional application claiming the benefit of and priority to U.S. application Ser. No. 14/180,912, filed Feb. 14, 2014, the entire contents of each of which are incorporated herein by reference.

BACKGROUND

In semiconductor manufacturing, various tools or devices may be used to monitor the fabrication processes. For example, an off-line, high speed camera or a video recorder is utilized to monitor the shape of a liquid stream or a mist from a nozzle during fabrication processes in order to determine if variation occurs in applying the liquid stream or mist. Images of shape variation, if any, are captured by the off-line, high speed camera or the video recorder but are not sent for analysis in real time. Operation of the nozzle may not be ceased when variation is detected.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
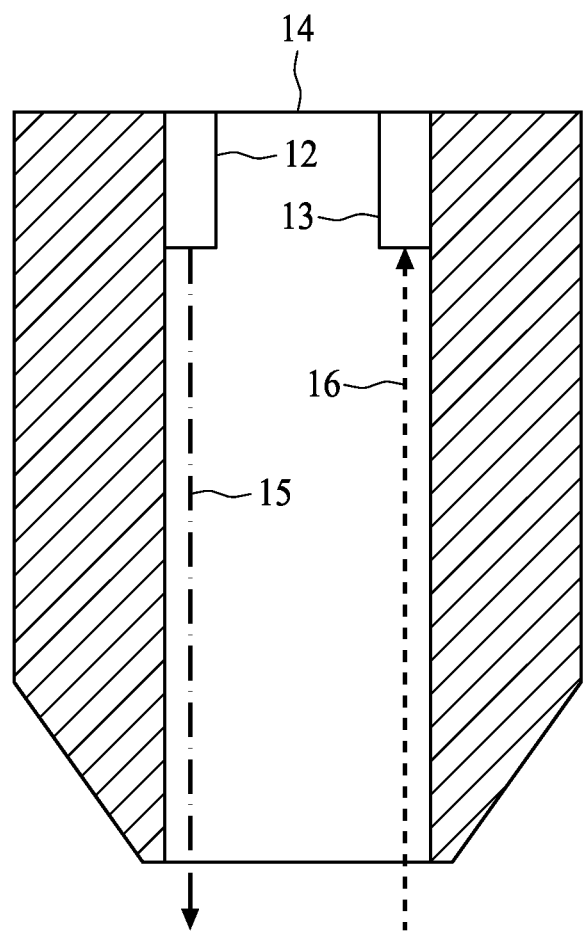
FIG. 1 is a schematic cross-sectional view of a nozzle in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic cross-sectional view of a nozzle 11 in accordance with some embodiments. Referring to FIG. 1, nozzle 11 comprises a light source 12, a light sensor 13 and a channel 14.

Nozzle 11 is configured to flow a fluid including, for example, a liquid stream, a gas or a mist. The liquid stream and the mist includes chemical solution and water.

In some embodiments, water includes distilled water with a refractive index of approximately 1.33, which is used in a clean process.

In some embodiments, the chemical solution includes $H_2SO_4$ with a refractive index of approximately 1.44, which is used for removing photo resist in a Caro's process.

In some embodiments, the chemical solution includes KOH with a refractive index of approximately 1.48, which is used for photo resist development.

In some embodiments, the chemical solution includes FH with a refractive index approximately 1.4, which is used for removing oxide.

In some embodiments, the chemical solution includes Tris-Borate-EDTA with a refractive index of approximately 1.63, which is used for removing oxide.

In some embodiments, the chemical solution includes HCL with a refractive index of approximately 1.34, which is used for removing nitride.

In some embodiments, the chemical solution includes $H_3PO_4$ with a refractive index of approximately 1.43, which is used for removing nitride.

In some embodiments, the chemical solution includes tetramethyl ammonium hydroxide with a refractive index of approximately 1.38, which is used for etching silicon.

Light source 12 is configured to emit light 15 via channel 14 towards liquid stream applied from nozzle 11 onto a surface of a wafer. In this embodiment, light source 12 is embedded in nozzle 11 and disposed near an exit of nozzle 11.

Light 15 emitted from light source 12 propagates in channel 14, travels out of nozzle 11 in the applied fluid and is reflected by a reflecting surface. Due to the optical phenomenon of Total Internal Reflection (TIR), emitting light 15 and reflected light are confined in the fluid applied. Moreover, the wavelength of light 15 may be predetermined so that light 15 does not affect the surface property and can be confined in the fluid. For example, when the wavelength of light 15 is smaller than 365 nm, photo resist layers of a wafer may be damaged. Moreover, when the wavelength of light 15 is over 365 nm, light 15 acts as a radio wave and is difficult to be confined in a liquid stream. In some embodiments, the wavelength of light 15 is in a range from approximately 365 nanometers (nm) to 760 nanometers (nm).

Light sensor 13 is configured to receive reflected light 16 from the fluid via channel 14. In this embodiment, light sensor 13 is embedded in nozzle 11 and disposed near the exit of nozzle 11. Moreover, light sensor 13 is opposite to light source 12.

In some embodiments, nozzle 11 is configured to operate under a liquid stream mode to allow a liquid stream to flow in channel 14. In other embodiments, nozzle 11 is configured to operate under a mist mode to allow a gas to flow in channel 14.

Figure 2:
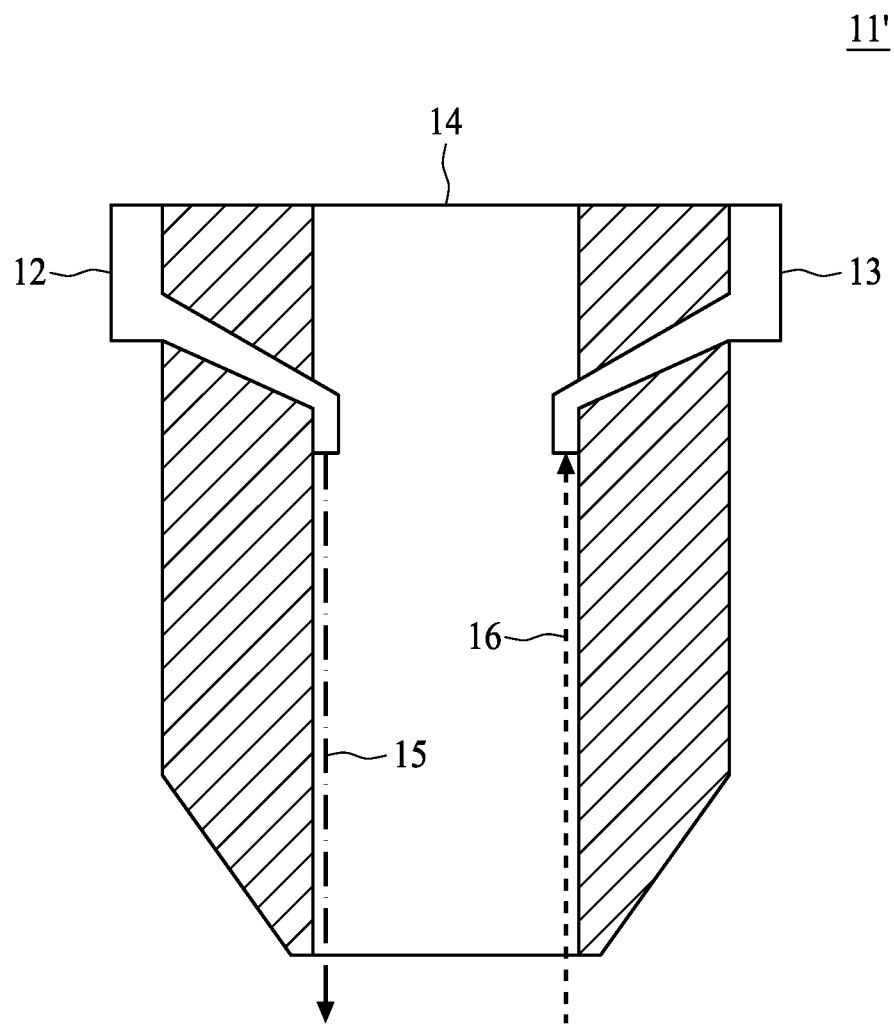
FIG. 2 is a schematic cross-sectional view of a nozzle in accordance with some embodiments.

FIG. 2 is a schematic cross-sectional view of a nozzle 11' in accordance with some embodiments. Referring to FIG. 2, nozzle 11' is similar to nozzle 11 illustrated in FIG. 1 except that, for example, light source 12 and light sensor 13 are disposed on an exterior surface of a housing of nozzle 11'. In an embodiment, light source 12 and light sensor 13 are detachable and can be easily replaced when light source 12 or light sensor 13 is damaged.

Figure 3:
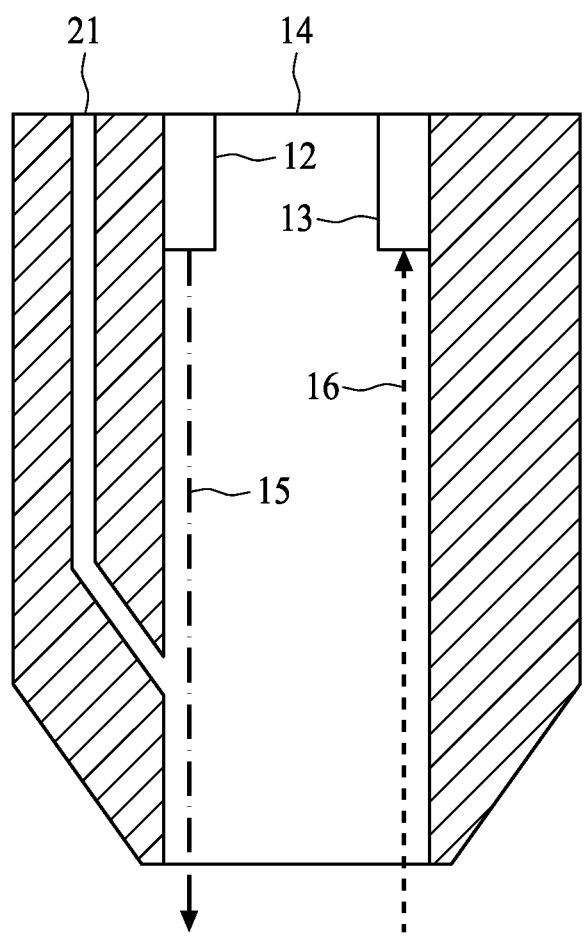
FIG. 3 is a schematic cross-sectional view of a nozzle in accordance with some embodiments.

FIG. 3 is a schematic cross-sectional view of a nozzle 11" in accordance with some embodiments. Referring to FIG. 3, nozzle 11" is similar to nozzle 11 illustrated in FIG. 1 except that, for example, at least one channel 21 for flowing a gas is provided. The at least one channel 21 communicates with channel 14. In an embodiment, channel 14 is configured to flow a liquid stream. As a result, nozzle 11" is capable of operating under a liquid stream mode or a mist mode.

Figure 4:
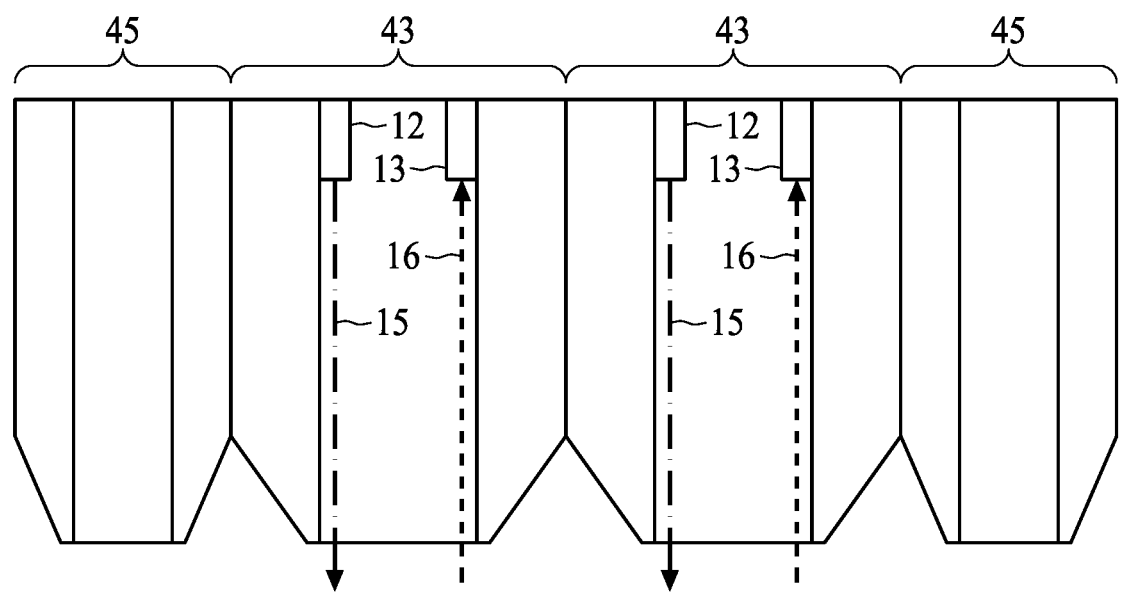
FIG. 4 is a schematic cross-sectional view of a multi-nozzle device in accordance with some embodiments.

FIG. 4 is a schematic cross-sectional view of a multi-nozzle device 41 in accordance with some embodiments. Referring to FIG. 4, multi-nozzle device 41 includes at least one liquid stream nozzle 43 and at least one gas nozzle 45. Each of the at least one liquid stream nozzles 43 is similar to nozzle 11" illustrated in FIG. 3 and is configured to flow a liquid stream. Moreover, each of the at least one liquid stream nozzle 43 includes light source 12 and light sensor 13. In this embodiment, each of the at least one gas nozzle 45 is configured to flow a gas.

Figure 5:
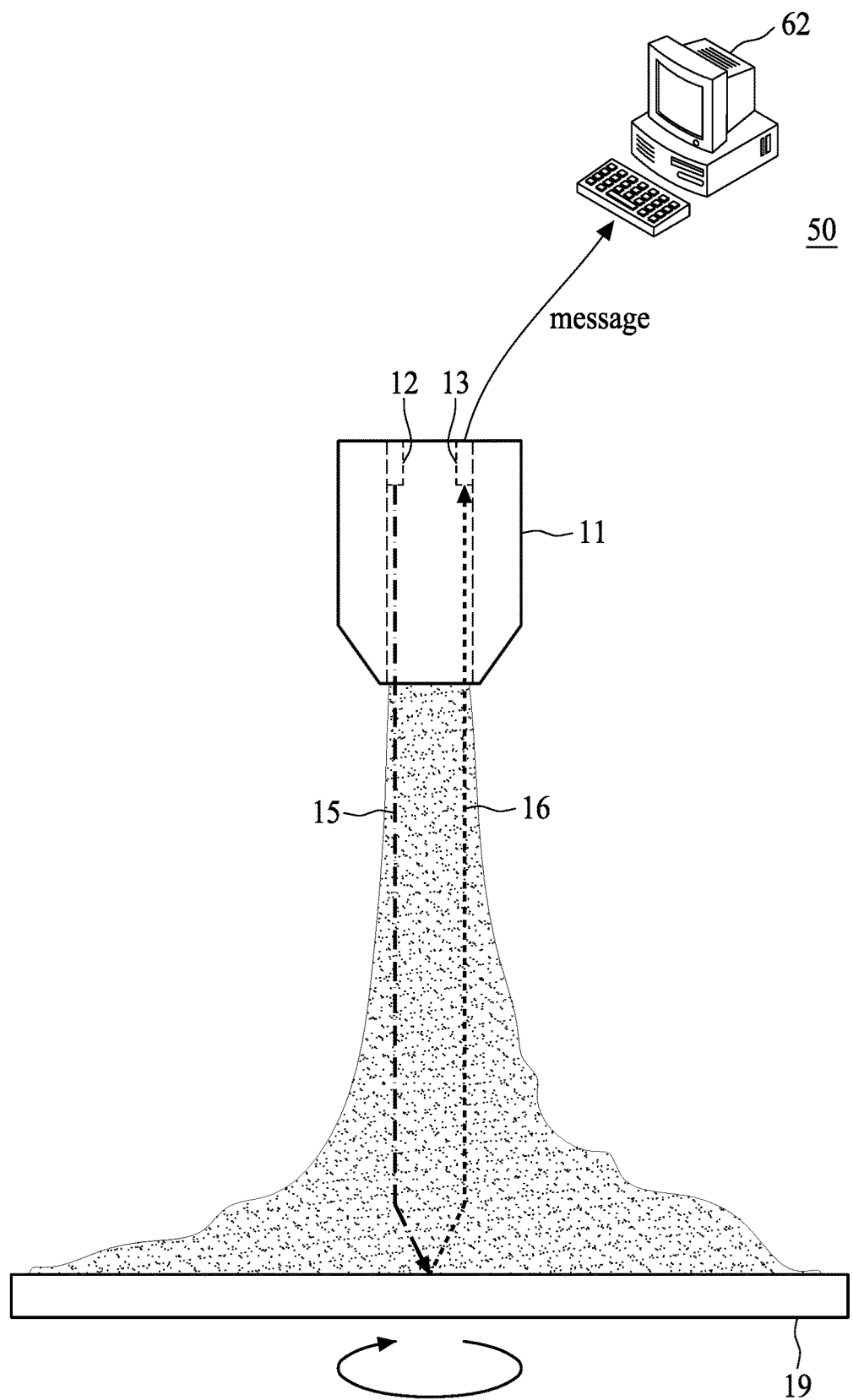
FIG. 5 is a schematic diagram of a monitoring system for detecting changes in the shape of a liquid stream in accordance with some embodiments.

FIG. 5 is a schematic diagram of a monitoring system 50 for detecting changes in the shape of a liquid stream in accordance with some embodiments. Referring to FIG. 5, nozzle 11 operating under a liquid stream mode applies a liquid stream 61 on a wafer 19. Reflected light 16 is collected when light 15 applied on wafer 19 is reflected back to nozzle 11. Light sensor 13 receives reflected light 16 in liquid stream 61. A signal indicative of a status of reflected light 16 received by light sensor 13 is transmitted to a data analysis device 62 such as a computer. Data analysis device 62 then generates a signal indicating whether a variation occurs.

Since the refractive index of the liquid stream 61 is greater than the refractive index of air, due to TIR, light 15 and reflected light 16 are substantially confined in liquid stream 61. Therefore, when the shape of liquid stream 61 changes because, for example, liquid stream 61 is discontinuous or broken, or liquid stream 61 includes a mist, or the shape of liquid stream 61 changes in size, a variation is detected at the time of the shape change of liquid stream 61. Meanwhile, operation of nozzle 11 will be stopped in real time when the variation is detected.

Figure 6:
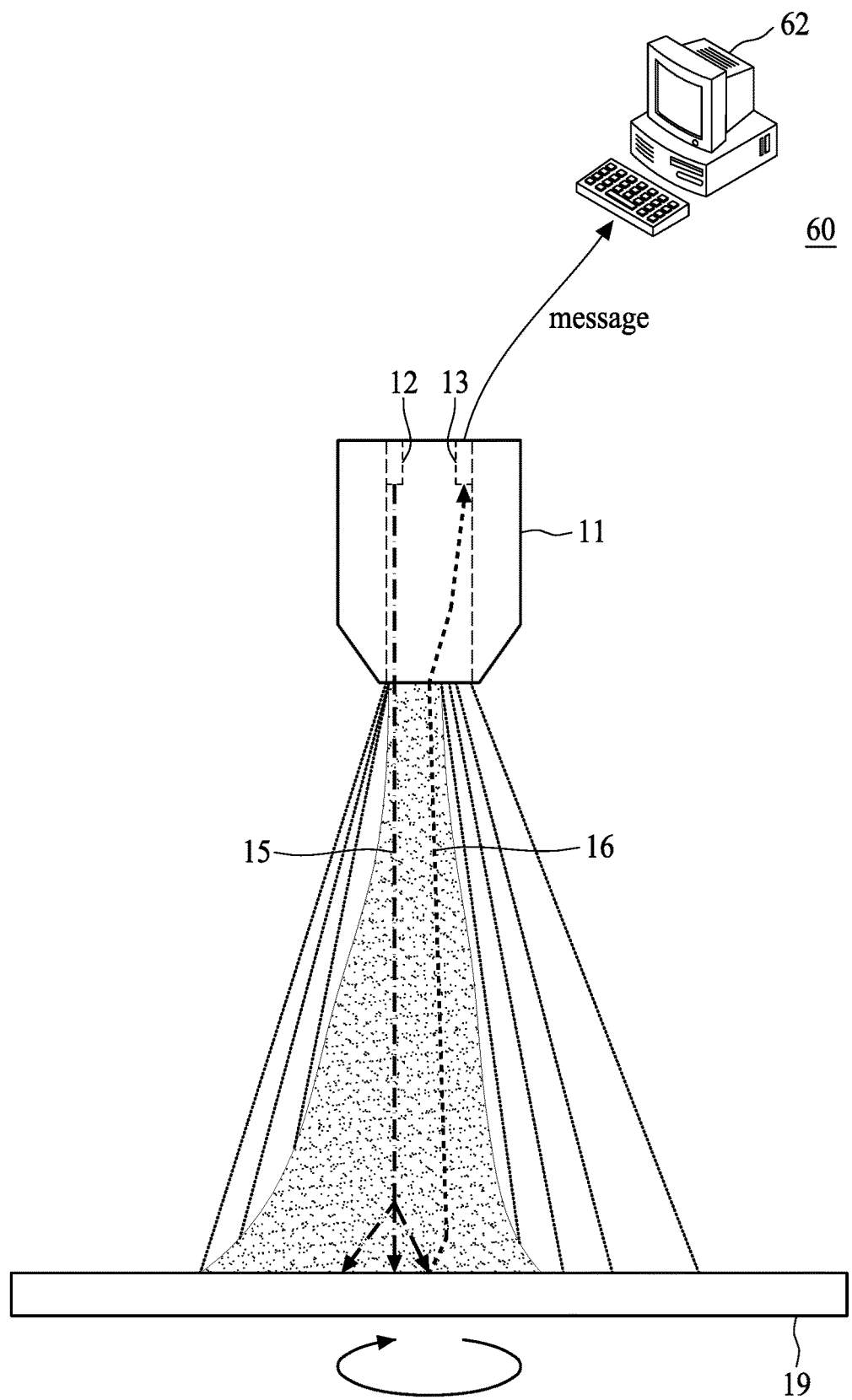
FIG. 6 is a schematic diagram of a monitoring system for detecting changes in the shape of a mist in accordance with some embodiments.

FIG. 6 is a schematic diagram of a monitoring system 60 for detecting changes in the shape of a mist 71 in accordance with some embodiments. Referring to FIG. 6, nozzle 11 applies a mist 71 on wafer 19. Since mist 71 includes discrete liquid drops, light 15 and light 16 are not able to propagate in mist 71. Therefore, when nozzle 11 operates under the mist mode, reflected light 16 is not received by light sensor 13. An indicative of a status of reflected light 16 received by light sensor 13 is transmitted to data analysis device 62. Data analysis device 62 then generates a signal indicating whether a variation occurs.

Since the refractive index of the mist 71 is greater than the refractive index of air, light 15 and reflected light 16 are still confined in mist 71. Under the mist mode, when the shape of mist 71 changes because, for example, mist 71 includes a liquid stream, a variation is detected at the time of the shape change of mist 71. Meanwhile, operation of nozzle 11 will be stopped in real time when the variation is detected.

Figure 7:
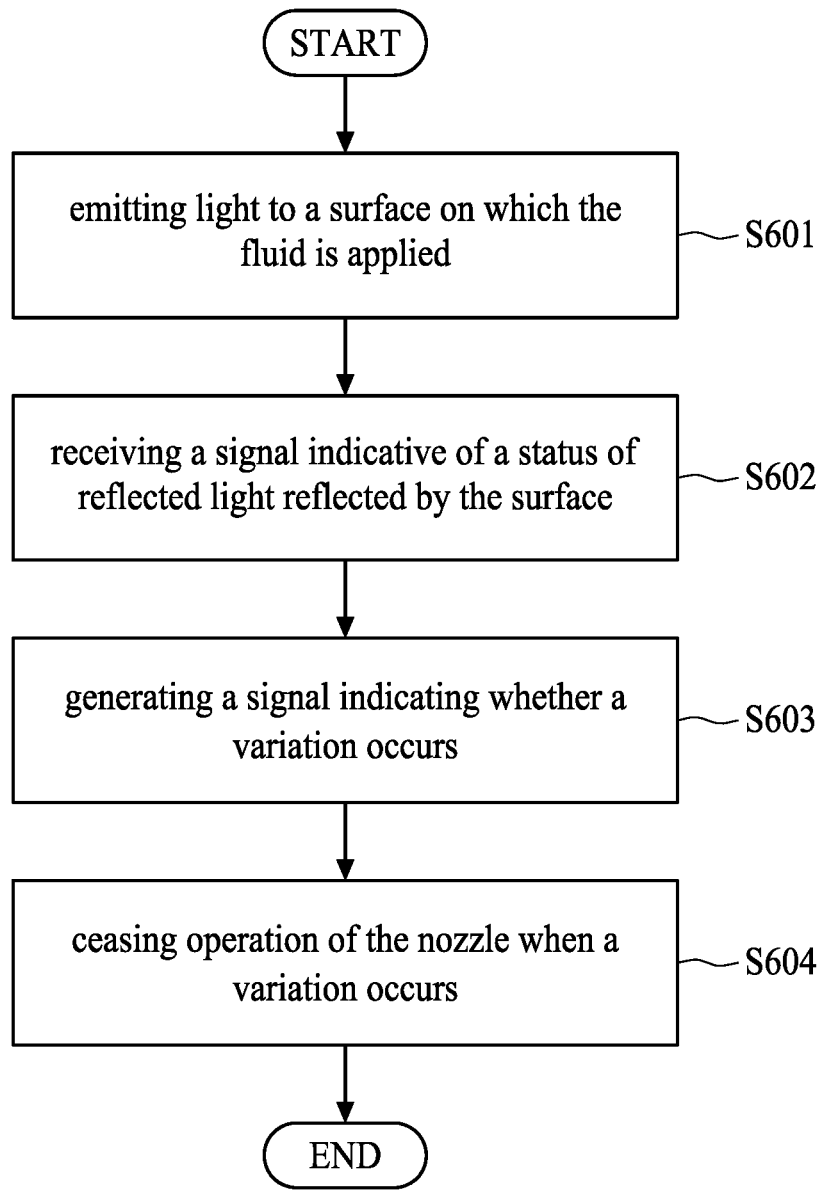
FIG. 7 is a flow diagram of a method for monitoring the shape of a fluid emitted by a nozzle in accordance with some embodiments.

FIG. 7 is a flow diagram of a method for monitoring the shape of a fluid emitted by a nozzle in accordance with some embodiments. Referring to FIG. 7, in operation S601, light is emitted from a light source toward the fluid applied via a channel of the nozzle to a surface of a wafer. The fluid includes a liquid stream or a mist.

When the nozzle operates under a liquid stream mode, a liquid stream and the emitting light are applied on a wafer. The reflected light reflected by the wafer is collected. Since the refractive index of the liquid stream is greater than that of air, the emitting light and the reflected light are able to propagate in the liquid stream. Therefore, under the liquid stream mode, the reflected light propagates back to the nozzle and received by a light sensor.

When the nozzle operates under a mist mode, a mist is applied on a wafer. Since the mist includes discrete liquid drops, the light is not able to propagate in the mist and no reflected light can be collected.

In operation S602, a signal indicative of a status of reflected light received by a light sensor is transmitted to and is recorded by a data analysis device.

In operation S603, a signal indicating whether a variation occurs is generated, by the data analysis device. In some embodiments, as in operation S604, a curve of signals collected over time is provided by the data analysis device. Moreover, a singularity point in the curve represents a variation in the fluid applying process.

When the nozzle operates under the liquid stream mode and the shape of the liquid stream changes because, for example, the liquid stream is broken, or the liquid stream includes a mist, or the shape of the liquid stream changes in size, reflected light does not propagate back to the nozzle and thus no reflected light is received by the light sensor. Therefore, a singularity point in the curve is detected. Meanwhile, operation of the nozzle will be stopped in real time when the singularity point is detected.

Moreover, when the nozzle operates under the mist mode, and the shape of the liquid stream changes because, for example, the mist includes a liquid stream, reflected light propagates back to the nozzle and received by the light sensor. Therefore, a singularity point in the curve is detected. Meanwhile, operation of the nozzle will be stopped in real time when the singularity point is detected.

In summary, a nozzle having a light source and a light sensor provides real-time monitoring during a fluid applying process. The nozzle utilizes "light" as a media to monitor variations in the shape of a liquid stream or a mist and thus provides a real-time detection. Effectively, semiconductor equipment having the nozzle can stop working instantly when an abnormal situation occurs.

According to an embodiment, a method of manufacturing a semiconductor device includes: receiving a workpiece on which the semiconductor device is manufactured; causing a nozzle to dispense a fluid toward a surface of the workpiece external to the nozzle, wherein the nozzle includes a first channel and a second channel that allow the fluid to flow through; emitting light, by a light source, from within the nozzle toward the surface while the nozzle is dispensing the fluid; receiving light reflected from the surface by a light sensor, the light source and the light sensor being disposed within the nozzle and opposite to each other, and the emitted light and the reflected light adapted to be contained within the fluid; and examining a status of the reflected light. The emitted light and the reflected light propagate in a direction parallel to a longitudinal axis of each of the first channel and the second channel.

According to an embodiment, a method of manufacturing a semiconductor device includes: dispensing a fluid from a nozzle to a workpiece separated from the nozzle; emitting light by a light source and causing the light to propagate within the fluid along a first channel, via the workpiece, and to be reflected to the nozzle along the first channel; receiving the reflected light by a light sensor opposite to the light source, the emitted light and the reflected light being contained within the fluid; and determining whether to stop dispensing the fluid according to the received light. The nozzle further includes a second channel adjacent to the first channel and allowing the fluid to flow through, wherein the emitted light and the reflected light propagate in a direction parallel to a longitudinal axis of each of the first channel and the second channel.

According to an embodiment, a method of manufacturing a semiconductor device includes: applying a fluid from a first channel and a second channel of a nozzle to a workpiece, the nozzle facing the workpiece; emitting light by a light source and configuring the light to propagate within the fluid along a first side of the first channel, via the workpiece, and back to the nozzle along a second side of the first channel, wherein the first channel and the second channel allow the fluid to flow through; receiving the propagated light by a light sensor disposed on the second side, wherein the emitted light and the received light propagate in a direction parallel to a longitudinal axis of each of the first channel and the second channel; and determining whether to stop applying the fluid according to the received light.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   receiving a workpiece on which the semiconductor device is manufactured;
   causing a nozzle to dispense a fluid toward a surface of the workpiece external to the nozzle, wherein the nozzle comprises a first channel and a second channel that allow the fluid to flow through;
   emitting light, by a light source, from within the nozzle toward the surface while the nozzle is dispensing the fluid;
   receiving light reflected from the surface by a light sensor, the light source and the light sensor being disposed within the nozzle and opposite to each other, and the emitted light and the reflected light adapted to be contained within the fluid; and
   examining a status of the reflected light,
   wherein the emitted light and the reflected light propagate in a direction parallel to a longitudinal axis of each of the first channel and the second channel.

2. The method of claim 1, wherein causing the nozzle to dispense the fluid comprises causing the nozzle to dispense a liquid stream through the first channel and causing the nozzle to dispense a gas through the second channel in communication with the first channel.

3. The method of claim 2, wherein the nozzle further comprises a housing having outer sidewalls and inner sidewalls between the outer sidewalls, the inner sidewalls and a first portion of the second channel are parallel to the longitudinal axis of the first channel, the inner sidewalls define the first channel, and the first portion of the second channel is spaced apart from the first channel and is between the inner sidewalls and the outer sidewalls.

4. The method of claim 1, wherein causing the nozzle to dispense the fluid comprises applying a mist or a liquid stream through the first channel of the nozzle.

5. The method of claim 1, further comprising determining whether to stop dispensing the fluid according to a status of the reflected light.

6. The method of claim 5, wherein the determining whether to stop dispensing the fluid comprises generating a signal according to the status of the reflected light and determining whether a variation of the fluid occurs according to the signal.

7. The method of claim 6, further comprising recording the signal subsequent to generating the signal.

8. The method of claim 6, wherein the determining whether a variation of the fluid occurs comprises:
   collecting the signal over time to generate a curve; and
   determining whether a singularity point exists in the curve.

9. The method of claim 6, wherein the variation of the fluid includes a size variation of the fluid.

10. The method of claim 6, further comprising stopping the dispensing of the fluid in response to determining that the variation of the fluid occurs.

11. The method of claim 10, wherein the stopping dispensing of the fluid comprises stopping the dispensing of the fluid in response to detecting a shape variation of the fluid.

12. A method of manufacturing a semiconductor device, comprising:
   receiving a workpiece on which the semiconductor device is manufactured;
   causing a nozzle to dispense a fluid toward a surface of the workpiece external to the nozzle, wherein the nozzle comprises a first channel and a second channel that allow the fluid to flow through;
   emitting light, by a light source, from within the nozzle toward the surface while the nozzle is dispensing the fluid;
   receiving light reflected from the surface by a light sensor, the light source and the light sensor being disposed within the nozzle and opposite to each other, and the emitted light and the reflected light adapted to be contained within the fluid;
   generating a signal indicating a status of the fluid according to the reflected light; and
   examining the status of the reflected light.

13. The method of claim 12, further comprising determining whether to stop applying the fluid according to the signal.

14. The method of claim 12, further comprising recording the signal subsequent to generating the signal.

15. The method of claim 12, wherein a wavelength of the emitted light is between 365 nm and 760 nm.

16. The method of claim 12, further comprising determining whether to stop dispensing the fluid according to a status of the reflected light.

17. A method of manufacturing a semiconductor device, comprising:
   receiving a workpiece on which the semiconductor device is manufactured;
   causing a nozzle to dispense a fluid toward a surface of the workpiece external to the nozzle, wherein the nozzle comprises a first channel and a second channel that allow the fluid to flow through;

emitting light, by a light source, from within the nozzle toward the surface while the nozzle is dispensing the fluid;

receiving light reflected from the surface by a light sensor, the light source and the light sensor being disposed within the nozzle and opposite to each other, and the emitted light and the reflected light adapted to be contained within the fluid;

examining a status of the reflected light; and determining whether a variation of the fluid occurs according to the status of the reflected light, wherein the emitted light and the reflected light propagate in a direction parallel to a longitudinal axis of each of the first channel and the second channel.

18. The method of claim 17, wherein the determining whether a variation of the fluid occurs comprises generating a curve based on the reflected light and determining whether a singularity point exists in the curve.

19. The method of claim 17, wherein the variation of the fluid includes a shape variation of the fluid.

20. The method of claim 17, wherein a wavelength of the emitted light is between 365 nm and 760 nm.

* * * * *